United States Patent [19]

Tanaka et al.

[11] Patent Number: 4,491,697

[45] Date of Patent: Jan. 1, 1985

[54] CONDENSER MICROPHONE

[75] Inventors: Masanori Tanaka; Kenjiro Endoh, both of Yokohama, Japan

[73] Assignee: Tokyo Shibaura Denki Kabushiki Kaisha, Kawasaki, Japan

[21] Appl. No.: 377,840

[22] Filed: May 13, 1982

[30] Foreign Application Priority Data

May 22, 1981 [JP] Japan .................................. 56-77747

[51] Int. Cl.$^3$ ...................... H04R 19/01; H04R 19/00; H03F 3/26

[52] U.S. Cl. ............................ 179/111 E; 179/111 R; 179/131; 330/269; 330/273; 363/133

[58] Field of Search ........... 179/111 E, 111 R, 131 R, 179/135, 121 R; 307/400; 330/269, 273; 363/131, 133, 135

[56] References Cited

U.S. PATENT DOCUMENTS

| | | | |
|---|---|---|---|
| 3,896,274 | 7/1975 | Fraim et al. | 179/111 E |
| 4,246,448 | 1/1981 | Tam et al. | 179/111 E |
| 4,298,925 | 11/1981 | Melling | 363/131 |

FOREIGN PATENT DOCUMENTS

| | | | |
|---|---|---|---|
| 0048902 | 4/1982 | European Pat. Off. . | |
| 882417 | 7/1953 | Fed. Rep. of Germany . | |
| 2155026 | 5/1973 | Fed. Rep. of Germany | 179/111 E |
| 2320811 | 11/1973 | Fed. Rep. of Germany | 179/111 E |
| 2411997 | 9/1974 | Fed. Rep. of Germany . | |
| 46-7975 | 2/1971 | Japan | 363/134 |
| 5082590 | 1/1977 | Japan | 179/111 E |

OTHER PUBLICATIONS

"Low-Power Inverter Ignites Gas Discharge Lamps", by Akavia Kaniel, *Electronics,* Jan. 13, 1981, p. 154.

Funkschau, vol. 51, No. 5, (Mar. 1979), "Ein Miniatur--Kondensator-Stereomikrof on", pp. 241-244.

National Technical Report, vol. 26, No. 6, Dec., 1980, "Push-Pull Type Condenser Microphone for Musical Instruments, by Michio Matsumoto et al., pp. 1060-1069.

Journal of the Audio Engineering Society, vol. 23, No. 7, Sep. 1975, "A Complementary Source Follower Circuit for Condenser Microphone Preamplifier", by: T. Ken Matsudaira et al., pp. 530-535.

*Primary Examiner*—Gene Z. Rubinson
*Assistant Examiner*—Danita R. Byrd
*Attorney, Agent, or Firm*—Oblon, Fisher, Spivak, McClelland & Maier

[57] ABSTRACT

A condenser microphone including an electrostatic transducer provided with at least one conductive vibrating plate and at least one fixed electrode arranged opposite the vibrating plate, and through which output voltages can be obtained in response to an acoustic input, and an impedance converter circuit connected to output terminals of electrostatic transducer, wherein said electrostatic transducer is arranged in such a way that two output voltages out of phase with respect to each other are obtained through its first and second output terminals, and said impedance converter circuit includes first and second field effect transistors of same conductivity channel type whose gates are connected to output terminals of electrostatic transducer, respectively, and whose drains are connected to a DC power supply, first and second impedance elements connected between gates of field effect transistors and ground to hold the DC potential of each gate at ground level, and an output circuit means for generating an output signal corresponding to the difference between source potentials of field effect transistors.

17 Claims, 9 Drawing Figures

CONDENSER MICROPHONE

BACKGROUND OF THE INVENTION

The present invention relates to a condenser microphone and more particularly, a condenser microphone provided with an impedance converter circuit of the push-pull type.

Various attempts have been tried to reduce the distortion of a condenser microphone and to make large the allowable input thereto. One of them is that an electrostatic transducer which obtains an electrical output signal responsive to an acoustic input signal or an impedance converter circuit for reducing the electric output impedance of this electrostatic transducer using two FETs (field effect transistor) is arranged in push-pull type.

The arrangement of the impedance converter circuit as a push-pull type is an effective way to enable a relatively simple circuit arrangement to reduce the harmonic distortion. The push-pull arrangement of impedance converter circuit is described in detail on pages 530–535, Vol. 23, J.A.E.S., for example. The impedance converter circuit described by this material comprises a complementary push-pull source follower consisting of an N-channel FET and a P-channel FET.

According to this impedance converter circuit, its output voltage varies from 0 V only to its power supply voltage. When the distortion factor is taken into consideration as a practical problem, it will follow that the allowable input level of this impedance circuit becomes substantially lower than its power supply voltage. According to the present inventor's tests, the allowable input level had a limit, 1 V in peak to peak and −9dB V (0dB V=1 V) in decibel notation, when its power supply voltage was 1.5 V. The allowable acoustic input level of the microphone naturally depends upon this value and often becomes unpractical when the allowable input level of impedance converter circuit takes such value.

It is considered at first that the power supply voltage is raised to increase the allowable input level of impedance converter circuit, so that the allowable acoustic input level may be raised. When dry cells are employed as a power supply, the number of cells may be increased or a DC-DC converter may be employed. However, the increase of cell number will cause the microphone to be larged-sized, which is not preferable in the case of portable microphone. If the DC-DC converter is employed, the power dissipation of cells will be remarkably hastened due to the power loss caused by the DC-DC converter. In addition, when an external power supply is employed instead of cells, it makes the handling of microphone troublesome.

SUMMARY OF THE INVENTION

The object of the present invention is to provide a condenser microphone enabling an allowable acoustic input level to be obtained high enough even when a power supply of low voltage such as a dry cell is employed.

According to the present invention, an electrostatic transducer for generating an output voltage in response to an acoustic input includes a conductive vibrating plate, fixed electrodes arranged in spaced relation with the vibrating plate interposed therebetween, and first and second output terminals through which two output voltages out of phase with respect to each other are obtained. An impedance converter circuit includes first and second FETs of the same conductive channel type whose gates are connected to first and second output terminals of electrostatic transducer and whose drains are connected to a DC power supply, first and second impedance elements connected between gates of FETs and ground to hold the DC potential of each gate at ground level, and an output circuit means for generating an output signal corresponding to the difference between source potentials of FETs.

According to the present invention, the sum of allowable input levels of source followers formed by first and second FETs, respectively, becomes equal to the allowable input level of impedance converter circuit, which is a value at least two times that of impedance converter circuit in the conventional condenser microphone. The allowable acoustic input level in the condenser microphone can be thus enhanced to a greater extent and the value of allowable acoustic input level thus obtained becomes practical enough even when dry cells, for example, are used as a power supply.

DETAILED DESCRIPTION OF THE PREFERRED EMBODIMENTS

Figure 1:
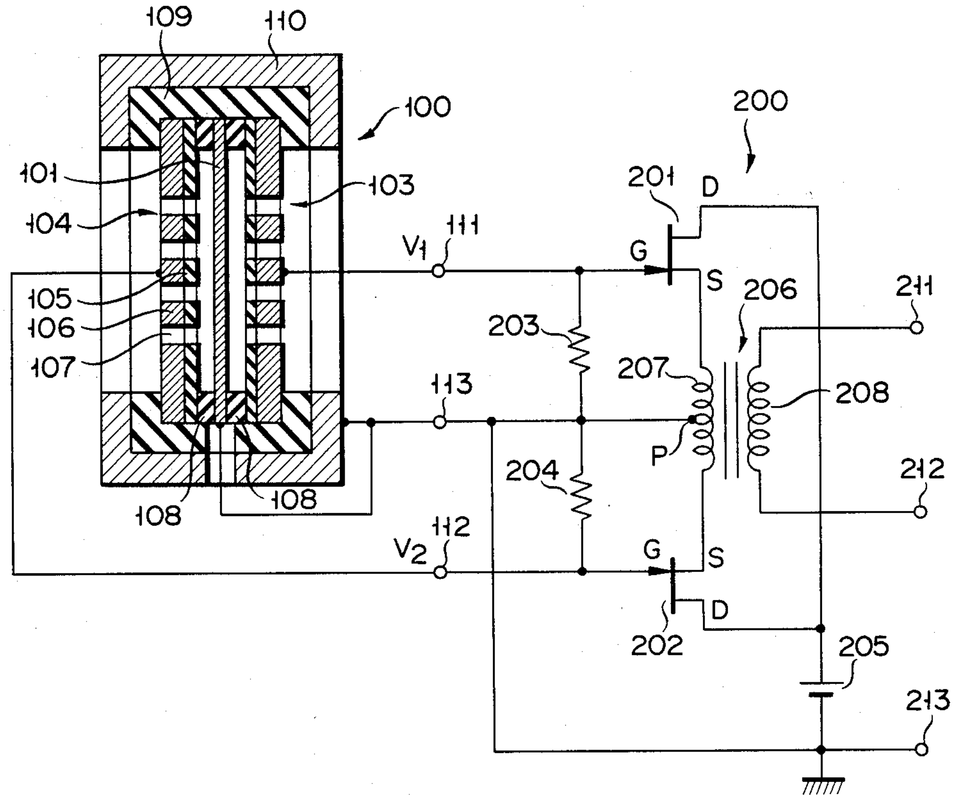
FIG. 1 is a view showing the arrangement of an embodiment according to the present invention.

An embodiment of a condenser microphone according to the present invention and shown in FIG. 1. comprises an electrostatic transducer 100 of the push-pull type and an impedance converter circuit 200 of the push-pull type. The electrostatic transducer 100 is cross-sectioned in FIG. 1.

The electrostatic transducer 100 includes,as main components, a conductive vibrating plate 101; and fixed electrodes 103 and 104 arranged in spaced relation with vibrating plate 101 interposed therebetween. The vibrating plate 101 is made of, for example, metal foil or high-molecular film whose surface is subjected to conductivity process. Each of the fixed electrodes 103 and 104 is constituted by an electret 105 made of high molecular compound and by a metal plate 106 to which the electret 105 is attached. Each of the fixed electrodes 103 and 104 has many acoustic penetrating bores 107. A ring-shaped insulating spacer 108 is interposed between vibrating plate 101 and fixed electrodes 103, 104 so as to hold vibrating plate 101 spaced about several tens μm, for example, from fixed electrodes 103 and 104. Each of circumferential end portions of vibrating plate 101 and fixed electrodes 103, 104 fixedly adheres to the inner circumference of a sleeve-shaped conductive housing 110 with an insulating sleeve 109 sandwiched therebetween.

The electret 105 on each of fixed electrodes 103 and 104 is electrified to have the same polarity. Therefore, the electret 105 applies a DC bias voltage between the vibrating plate 101 and the fixed electrodes 103, 104. When acoustic input is applied to electrostatic transducer 100, therefore, vibrating plate 101 is vibrated to change the spaces between vibrating plate 101 and fixed electrodes 103 and 104, whereby output voltages $V_1$ and $V_2$ equal in absolute value and out of phase with respect to each other are generated between the vibrating plate 101 and the fixed electrodes 103, in response to the acoustic input. These output voltages $V_1$ and $V_2$ are outputted from first and second output terminals 111 and 112, respectively. The vibrating plate 101 is grounded through a ground terminal 113 in this case.

The impedance converter circuit 200 includes, as a main component, a push-pull amplifier circuit comprising two sets of source followers using first and second FETs 201 and 202 of the same conductivity channel type (N-channel type in this case). Gates of FETs 201 and 202 are connected to first and second output terminals 111 and 112 of electrostatic transducer 100, respectively, and grounded through first and second impedance elements 203 and 204, respectively. Impedance elements 203 and 204 are intended to prevent gates of FETs 201 and 202 from being equivalently opened because of extremely high output impedance of electrostatic transducer 100 to make their DC potentials unstable. Impedance elements 203 and 204 are of high resistance in this case. When no input signal is applied to impedance converter circuit 200, that is, when no acoustic input is applied to electrostatic transducer 100 the potential of each of gates of FETs 201 and 202, i.e. DC potential can thus be held at ground level. Instead of resistors, inductors may be employed as impedance elements 203 and 204.

Drains (D) of FETs 201 and 202 are connected to a DC power supply 205 which consists of a dry cell, for example. Sources (S) of FETs 201 and 202 are connected, respectively, to both ends of a primary coil 207 of a transformer 206 which serves as an output circuit means. An output signal corresponding to the difference between source potentials of FETs 201 and 202 is lead out, as a balanced voltage signal, between output terminals 211 and 212 through both ends of a secondary coil 208. An intermediate tap P is provided on the primary coil 207 of transformer 206 and earthed.An earthing terminal 213 of impedance converter circuit 200 is connected to ground terminal 113 of electrostatic transducer 100.

Figure 2:
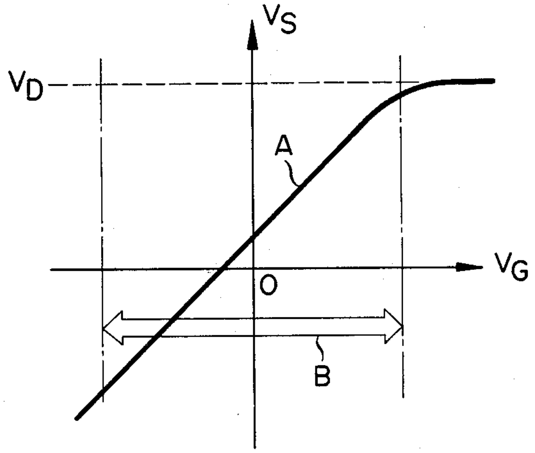
FIG. 2 is a view showing the input and output characteristic of impedance converter circuit shown in FIG. 1.

According to the embodiment thus arranged, the AC relation between gate voltage $V_G$ and source voltage $V_S$ of each of FETs 201 and 202 is as shown by a solid line A in FIG. 2. When gate voltage $V_G$ rises in positive direction, source voltage $V_S$ also rises substantially linearly in positive direction but does not exceed over voltage $V_D$ of DC power supply 205, as apparent from FIG. 2. When gate voltage $V_G$ changes in negative direction, source voltage $V_S$ is dropped to negative one because of back electromotive force excited by the inductance of primary coil 207 of transformer 206. Therefore, the range within which gate voltage $V_G$ is allowed to change, that is, the allowable input level of each source follower of FETs 201 and 202 becomes as shown by an arrow B in FIG. 2 and its value from peak to peak becomes larger than power supply voltage $V_D$. According to tests, it was easy to obtain a value of 2 V or more from peak to peak as the allowable input level of each source follower, when $V_D = 1.5$ V, for example.

As described above, the allowable input level of each of two sets of source followers consisting of FETs 201 and 202 becomes larger than $V_D$. However, the allowable input level relative to the impedance converter circuit becomes two times that of one set of source follower. Namely, gain and phase characteristic are the same through paths going from output terminals 111 and 112 of electrostatic transducer 100 to sources of FETs 201 and 202, but output voltages $V_1$ and $V_2$ of output terminals 111 and 112 are equal in amplitude but reverse in phase. After the changes of these output voltages $V_1$ and $V_2$ pass through the respective paths, the difference between output voltages $V_1$ and $V_2$ is taken, as an output signal, between output terminals 211 and 212 of impedance converter circuit 200 through transformer 206, so that the amplitude of this output signal becomes about two times that of $V_1$ and $V_2$. Therefore, the allowable input level relative to the impedance converter circuit 200 becomes two times that of each source followers consisting of one of FETs 201 and 202, a value larger than 2 $V_D$.

However, this allowable input level becomes smaller practically, considering the distortion factor. According to tests, the allowable input level of impedance converter circuit 200 was 4 V from peak to peak and +3dB V (0dB V=1 V) in decibel notation, when $V_D = 1.5$ V and under such condition that the distortion factor can be held at a satisfactory value. However, the value thus obtained is remarkably larger than that obtained through the impedance converter circuit in the already-described conventional condenser microphone. Therefore, the allowable acoustic input level of condenser microphone can also be enhanced remarkably.

According to the present invention as described above, a remarkable increase of allowable acoustic input level is made possible without using a power supply of high voltage, that is, without increasing the number of dry cells employed, or using a DC-DC converter or an external power supply. According to the embodiment particularly shown in FIG. 1, the allowable acoustic input level can be enhanced more effectively using the back electromotive force due to the inductance of primary coil 207 in transformer 206.

Since the impedance converter circuit 200 has a push-pull source follower arrangement consisting of FETs 201 and 202, secondary harmonic distortion components due to the non-linearity of the FETs cancel each other to thereby obtain a low distortion factor. The distortion factor can also be made low by making the electrostatic transducer 100 a push-pull type as shown in FIG. 1.

FETs 201 and 202 employed in the impedance converter circuit 200 according to the present invention are of the same conductivity channel type. Therefore, FETs same in characteristic are easily available. Since the P-channel FET has an input capacity larger than that of N-channel FET, the former is not suitable for use of the impedance converter circuit in the condenser microphone. The present invention enables impedance converter circuit 200 to be formed using only N-channel FETs of small input capacity, thus making it advantageous to connect impedance converter circuit 200 to electrostatic transducer 100.

FIGS. 3 through 6 show other embodiments of an electrostatic transducer employed in the present invention. In the embodiment shown in FIG. 3, the front and back of electrostatic transducer shown in FIG. 1 are covered with electrostatic shield members 121 and 122 having conductivity and acoustic penetrating bores 123 and 124. Electrostatic shield members 121 and 122 closely adhere to end faces of conductive housing 110 and are earthed via ground terminal 113. With this arrangement, the noise due to electrostatic induction from outside hardly appears at outward terminals 111 and 112, since the acoustic transducer is electrostatically shielded. Therefore, the electrostatic transducer operates in a further reliable manner and the S/N ratio of the output signal of the electrostatic transducer can be improved. This is particularly advantageous to the portable condenser microphone which receives large electrostatic induction by a user's hands.

Figure 4:
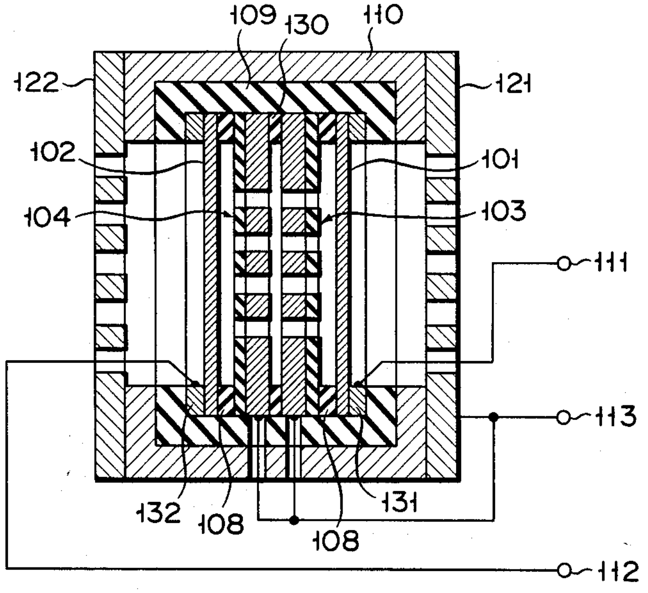

The embodiment shown in FIG. 4 employs two vibrating plates and two fixed electrodes paired with the respective vibrating plates. Namely, the first and second vibrating plates 101 and 102 and the first and second fixed electrodes 103 and 104 are so arranged that fixed electrodes 103 and 104 are opposite to each other. In this case, ring-shaped insulating spacer 130 are inserted between fixed electrodes 103 and 104, and ring-shaped conductive spacers 131 and 132 are inserted between outer sides of vibrating plates 101, and 102 and insulating sleeve 109. Vibrating plates 101 and 102 are connected through conductive spacers 131 and 132 to output terminals 111 and 112, respectively. Fixed electrodes 103 and 104 are earthed through earthing terminal 113.

The embodiment shown in FIG. 4 allows the pair of vibrating plate 101 and fixed electrode 103, and the pair of vibrating plate 102 and fixed electrode 104 to perform push-pull operation, whereby the secondary harmonic distortion of electrostatic transducer can be reduced on the same principle as in FIG. 1. In addition, output signals out of phase with respect to each other can be generated through output terminals 111 and 112.

Although vibrating plates 101 and 102 are connected to output terminals 111 and 112 while fixed electrodes 103 and 104 are connected to ground terminal 113 in this embodiment, quite the same function can be achieved even when fixed electrodes 103 and 104 are connected to output terminals 111 and 112 while vibrating plates 101 and 102 are connected to ground terminal 113.

Figure 3:
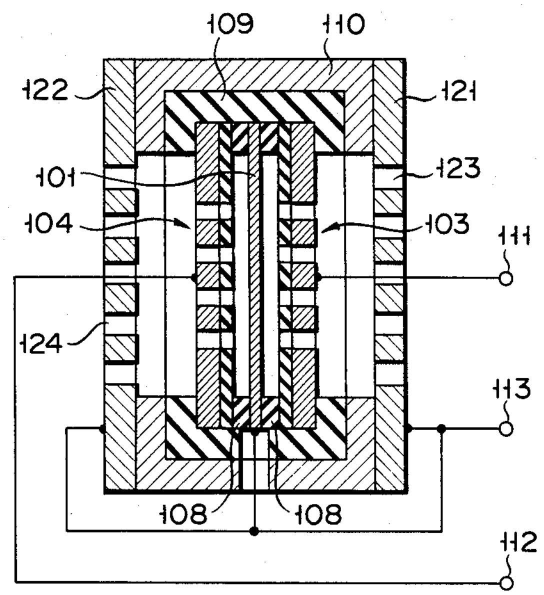
FIGS. 3 through 9 are views showing other embodiments of the present invention.
Figure 5:
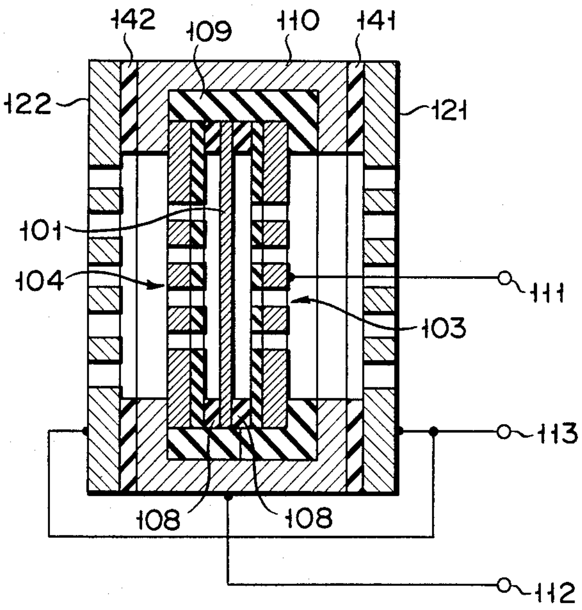

The embodiment shown in FIG. 5 is fundamentally different from those shown in FIGS. 1 and 3 in that vibrating plate 101 is not grounded but floating in potential. Even when thus arranged, DC voltages at output terminals 111 and 112 are each held at ground level through impedance elements 203 and 204 of FIG. 1, thus enabling the operation to be held stable. Although the fixed electrode 104 is connected via conductive housing 110 to output terminal 112 in FIG. 5, fixed electrode 104 may be connected directly to output terminal 112.

Figure 6:
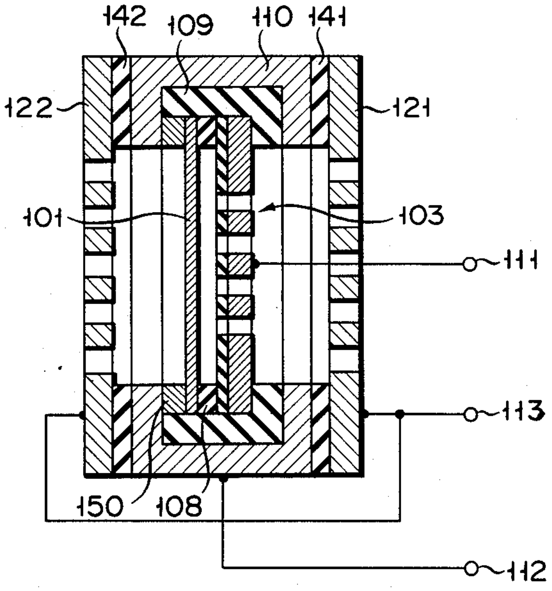

In contrast to those shown in FIGS. 1, 3, 4 and 5 and having the electrostatic transducer arranged in push-pull type, the example shown in FIG. 6 has a single arrangement consisting of a sheet of vibrating plate 101 and a unit of fixed electrode 103. The fixed electrode 103 is connected to output terminal 111, and vibrating plate 101 is connected through ring-shaped conductive spacer 150 and conductive housing 110 to output terminal 112 in this case, so that output signals reverse to each other in phase can be obtained through these output terminals 111 and 112.

Electrostatic shield members 121 and 122 described referring to FIG. 3 are employed in the embodiments shown in FIGS. 5 and 6, but since conductive housing 110 is connected to output terminal 112, insulating spacers 141 and 142 are interposed between conductive housing 110 and electrostatic shield member 121 and between conductive housing 110 and electrostatic shield member 122. It may be arranged in FIGS. 5 and 6 that electrostatic shield members 121 and 122 and ground terminal 113 are omitted and that the electrostatic transducer is not grounded.

Although each of embodiments described above has the electrostatic transducer of electret type, the present invention can be applied to a case where an electrostatic transducer of such type that DC bias voltage is supplied between the vibrating plate and fixed electrodes by an external power supply is employed.

Figure 7:
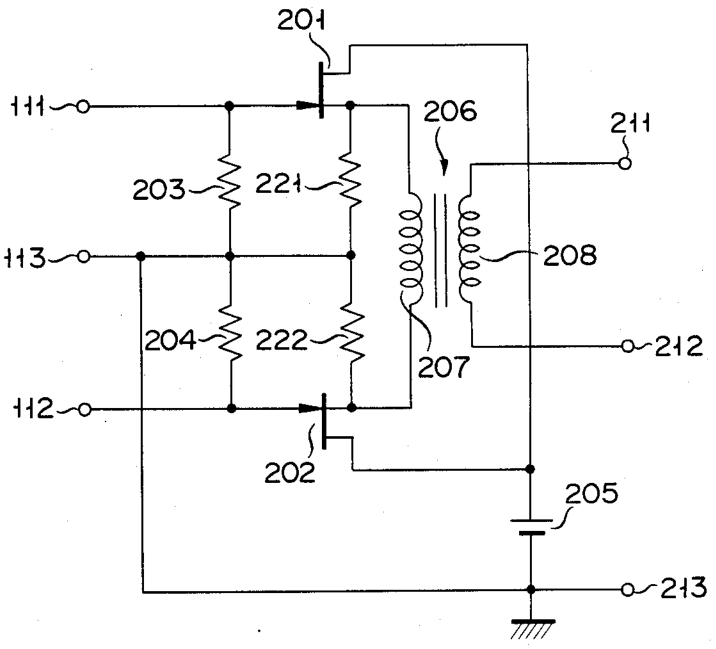
Figure 8:
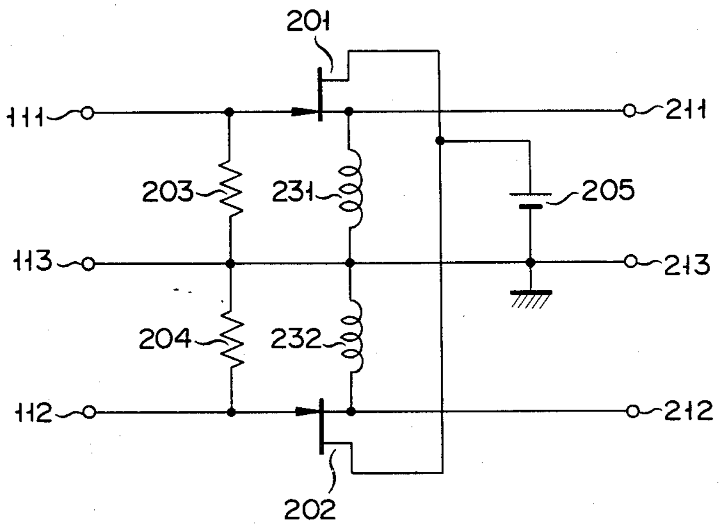
Figure 9:
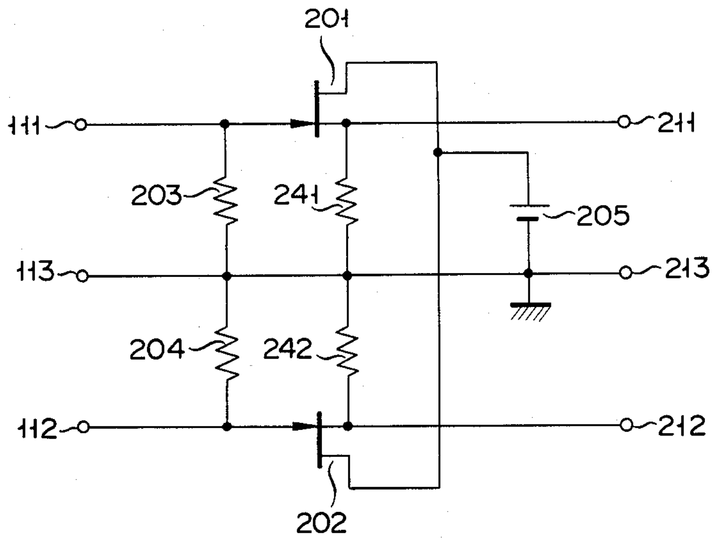

FIGS. 7 through 9 show other arrangements of impedance converter circuit according to the present invention. Sources of FETs 201 and 202 are grounded through resistors 221 and 222 in FIG. 7 instead of grounding the intermediate tap P on primary coil 207 of transformer 206 in FIG. 4.

Instead of employing transformer 206, sources of FETs 201 and 202 are grounded through inductors 231 and 232 and connected to output terminals 211 and 212, respectively, in FIG. 8.

The impedance converter circuit shown in FIG. 9 uses resistors 241 and 242 instead of inductors 231 and 232 used in FIG. 8. The impedance converter circuit shown in FIG. 9 cannot use the back electromotive force due to inductance, whereas those shown in FIGS. 1 and 8 can use it.Therefore, its allowable input level is reduced about half but is about two times higher than that of conventional one. The embodiment shown in FIG. 9 is more suitable for being small-sized because the transformer and inductors occupying large space are not used.

What we claim is:

1. A condenser microphone comprising:

an electrostatic transducer including at least one conductive vibrating plate, at least one fixed electrode, and first and second output terminals, two output voltages which are out of phase with respect to each other being generated between the vibrating plate and fixed electrode in response to vibration of the vibrating plate, and the generated two output voltages being supplied from the first and second terminals, respectively;

a first field effect transistor and a second field effect transistor both of the same conductivity channel type, gates of said first and second field effect transistors being connected to the first and second output terminals of said electrostatic transducer, respectively, and drains of said first and second field effect transistors being connected to a DC power supply;

a first resistor and a second resistor both connected between the gate of said first field effect transistor and ground and between the gate of said second field effect transistor and ground, respectively, to hold the DC potential of each of said gates at ground level; and output circuit means including a transformer with a primary coil and a secondary coil, the primary coil being directly connected between the sources of the first and second field effect transistors, and a output signal which corresponds to the difference between the source potentials of the first and second field effect transistors being picked up from the second coil.

2. A condenser microphone according to claim 1, wherein said electrostatic transducer includes two fixed electrodes arranged one on each side of one vibrating plate and with each electrode connected to one of said first and second output terminals, respectively.

3. A condenser microphone according to claim 2, wherein said vibrating plate is earthed.

4. A condenser microphone according to claim 1, wherein said electrostatic transducer has a first vibrating plate, a second vibrating plate, a first fixed electrode and a second fixed electrode, said first and second fixed electrodes being interposed between said first and second vibrating plates, wherein one of said first vibrating plate and said first fixed electrode is connected to said first or second output terminal, and wherein one of said second vibrating plate and said second fixed electrode is connected to the remaining output terminal.

5. A condenser microphone according to claim 4, wherein those of said first and second vibrating plates and said first and second fixed electrodes which are not connected to said first or second output terminal are grounded.

6. A condenser microphone according to claim 1, wherein said electrostatic transducer has at least one electret and a DC bias voltage is applied by the electret between the vibrating plate and the fixed electrode.

7. A condenser microphone according to claim 6, wherein said electret is bonded to that side of said fixed electrode which faces the vibrating plate.

8. A condenser microphone according to claim 2, wherein said electrostatic transducer has two electrets and a DC bias voltage applied by the electrets between the vibrating plate and the fixed electrodes.

9. A condenser microphone according to claim 4, wherein said electrostatic transducer has two electrets and a DC bias voltage applied by the electrets between the vibrating plates and the fixed electrodes.

10. A condenser microphone according to claim 8, wherein said electrets are bonded to that side of said fixed electrodes which faces the vibrating plate.

11. A condenser microphone according to claim 9, wherein said electrets are bonded to that side of said fixed electrodes which faces the vibrating plates.

12. A condenser microphone according to claim 1, wherein said electrostatic transducer is covered by a conductive electrostatic shield member which is grounded.

13. A condenser microphone according to claim 2, wherein said electrostatic transducer is covered by a conductive electrostatic shield member which is grounded.

14. A condenser microphone according to claim 4, wherein said electrostatic transducer is covered by a conductive electrostatic shield member which is grounded.

15. A condenser microphone according to claim 6, wherein said electrostatic transducer is covered by a conductive electrostatic shield member which is grounded.

16. A condenser microphone according to claim 1, wherein said primary coil of said transformer has an intermediate tap thereon, and said intermediate tap is grounded.

17. A condenser microphone according to claim 1, wherein said output circuit means further includes third and fourth resistors and the sources of said first and second field effect transistors are grounded through said third and fourth resistors.

* * * * *